United States Patent [19]

Yamaguchi et al.

[11] 4,112,324

[45] Sep. 5, 1978

[54] MOUNTING FOR PLURAL PIEZOELECTRIC VIBRATOR UNITS

[75] Inventors: Kazumasa Yamaguchi; Kunio Nasaki; Masanori Ohshiro, all of Komae, Japan

[73] Assignee: Kabushiki-Kaisha Kinsekisha-Kenkyujo, Tokyo, Japan

[21] Appl. No.: 768,525

[22] Filed: Feb. 14, 1977

[30] Foreign Application Priority Data

Feb. 14, 1976 [JP] Japan .............................. 51-16574[U]
Apr. 20, 1976 [JP] Japan .............................. 51-49695[U]
May 14, 1976 [JP] Japan .............................. 51-61033[U]

[51] Int. Cl.$^2$ .......................................... H01L 41/10
[52] U.S. Cl. ..................................... 310/353; 310/342
[58] Field of Search ............... 310/312, 340, 341, 342, 310/348, 354, 355, 351–353, 356

[56] References Cited

U.S. PATENT DOCUMENTS

| | | | |
|---|---|---|---|
| 2,327,487 | 8/1943 | Bach | 310/356 |
| 2,410,193 | 10/1946 | Bach | 310/355 |
| 2,508,232 | 5/1950 | Dewey | 310/353 |
| 2,525,138 | 10/1950 | Kral | 310/342 |
| 2,705,760 | 4/1955 | Minnich | 310/355 X |
| 2,824,219 | 2/1958 | Fisher et al. | 310/312 |
| 3,047,749 | 7/1962 | Fisher | 310/342 X |
| 3,359,435 | 12/1967 | Webb | 310/354 |
| 3,535,569 | 10/1970 | Clawson et al. | 310/355 |
| 3,622,816 | 11/1971 | McGrew | 310/312 |
| 3,723,920 | 3/1973 | Sheaman et al. | 310/342 X |
| 3,988,621 | 10/1976 | Nakayama et al. | 310/348 |

Primary Examiner—Mark O. Budd
Attorney, Agent, or Firm—William Anthony Drucker

[57] ABSTRACT

A piezoelectric vibrator unit has a substantially flat holder case which is provided on one side with a recess or recesses each encasing a piezoelectric vibrator plate. The bottom wall of each recess is provided therethrough with a port or ports each at a position which corresponds to an excitation electrode formed on the vibrator plate. Another side of the holder case is used for masking means for forming, for the micro-adjustment of vibration frequency, a vacuum evaporated film on the excitation electrode.

7 Claims, 25 Drawing Figures

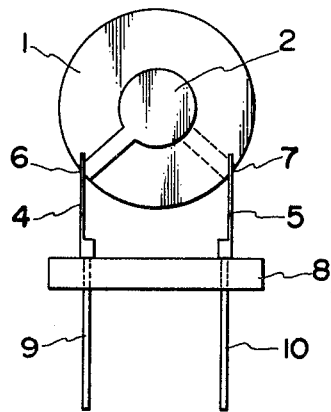
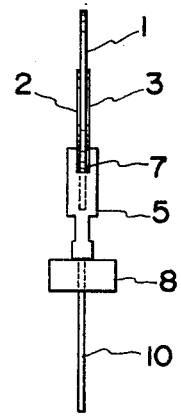
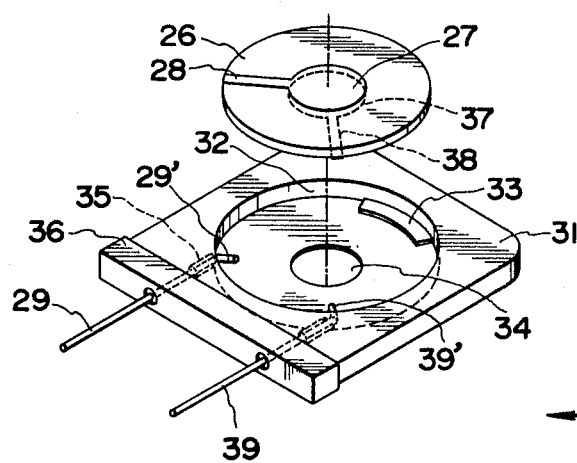
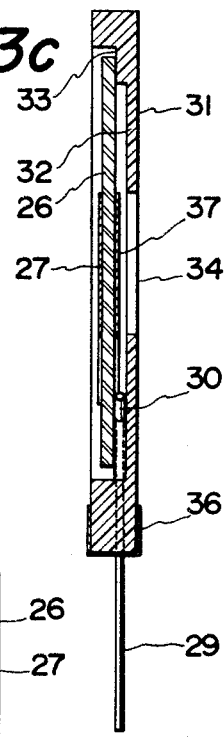
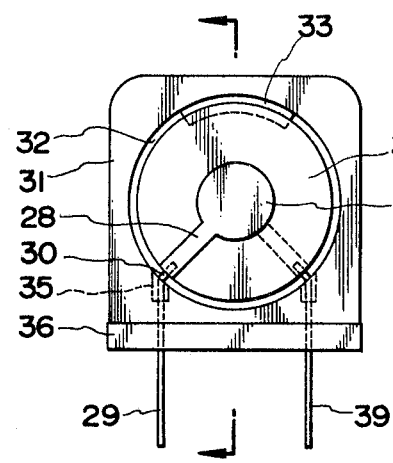

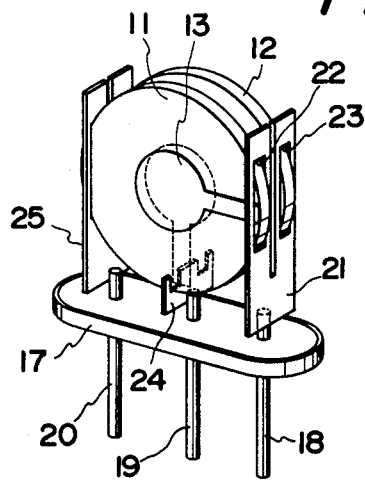
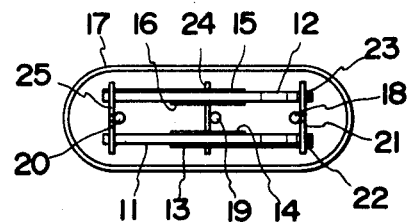
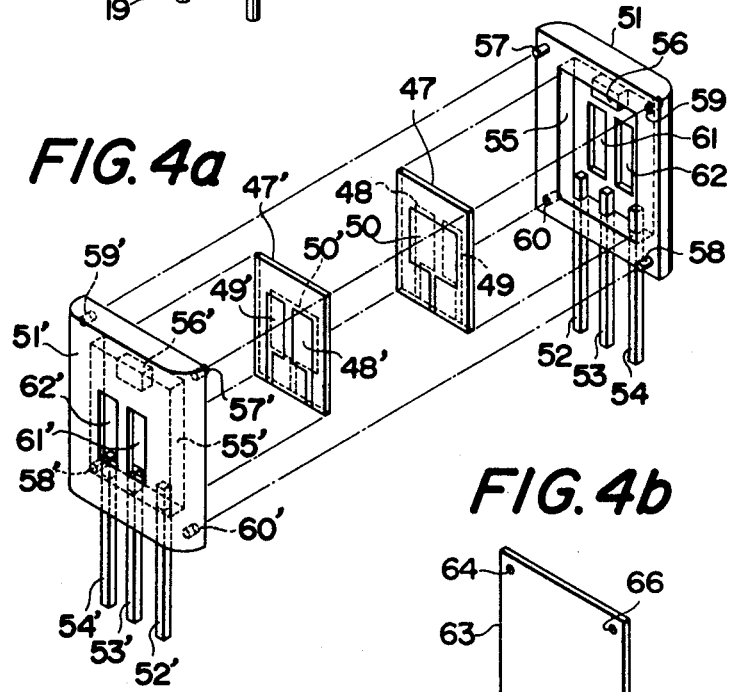
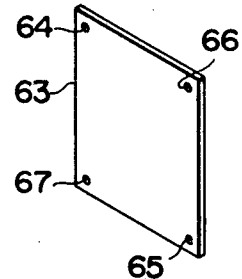

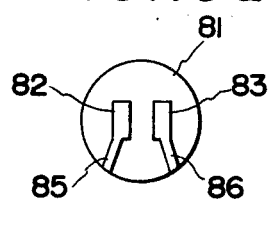
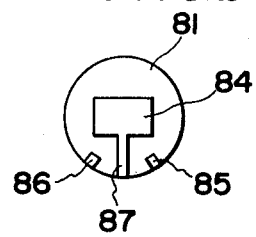
FIG. 10a  FIG. 10b
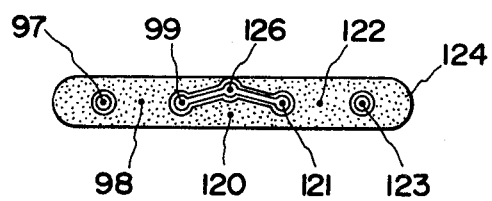
FIG. 11
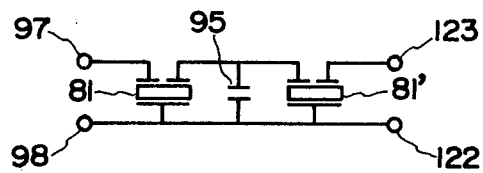
FIG. 12

MOUNTING FOR PLURAL PIEZOELECTRIC VIBRATOR UNITS

BACKGROUND OF INVENTION

This invention relates to piezoelectric vibrator units having holder means holding a vibrator plate or plates.

FIGS. 1a and 1b show a piezoelectric vibrator unit of prior art having a vibrator plate 1 mounted on a base support 8 by means of electrically conductive supporting arms 4 and 5. Vibrator plate 1 may be of quartz, lithium tantalate, lithium niobate, or piezoelectric ceramics, and has a pair of excitation electrodes which are formed on the central portions of said vibrator plate at opposite sides thereof. Supporting arms 4 and 5 which support vibrator plate 1 by means of notches 6 and 7 and a binding agent are fixed to lead wires 9 and 10. Accordingly, excitation electrodes 2 and 3 are connected respectively electrically through the leads extending to the periphery of the plate 1, to lead wires 9 and 10.

In the manufacture of such a piezoelectric vibrator unit of prior art, vibrator plate 1 is subjected, prior to being mounted on base support 8, to vacuum evaporation processes to form excitation electrodes 2 and 3 by using a masking means. Subsequently, vibrator plate 1 is mounted as shown in FIGS. 1a and 1b, and is subjected to a secondary vacuum evaporation process so as to form a vacuum evaporated film on one of said excitation electrodes so that the vibrator plate can be vibrated at a desired vibration frequency.

And, in such a secondary vacuum evaporation process for the microadjustment of the vibration frequency, the vacuum evaporated film must be formed correctly on an excitation electrode formed by a vacuum evaporation process which has been effected previously. Otherwise, generation of spurious changes in dynamic capacitance and dynamic inductance of the plate will be caused.

Furthermore, in a piezoelectric vibrator unit of prior art as mentioned in the foregoing, due to weakness of supporting means such as supporting arms 4 and 5 as compared with the weight of the vibrator plate, the excitation electrodes which have been formed in said prior vacuum evaporation are apt to be dislocated from predetermined positions for the mask which are to be subjected to said secondary vacuum evaporation through said mask. And, it will readily be seen that the alignment of positions for the secondary vacuum evaporation is very troublesome.

Another piezoelectric vibrator unit having two vibrator plates of prior art is shown in FIGS. 2a and 2b. In the figures, 11 and 12 are respectively a piezoelectric vibrator plate such as indicated at 1 in FIGS. 1a and 1b. 13 and 14, and, 15 and 16 are respectively a pair of excitation electrodes. 17 is a base board. 18, 19, and 20 are respectively a lead wire. 21, 24, and 25 are respectively a supporting arm. And, 22 and 23 are respectively a slit which corresponds to notches 6 and 7 in FIGS. 1a and 1b.

Also in such a piezoelectric vibrator unit for two vibrator plates of prior art, the drawbacks and difficulties as stated in the foregoing with respect to a vibrator unit for single vibrator plate are common. Moreover, serious drawbacks as will be stated in the following are inevitable in such a vibrator unit for two vibrator plates of prior art.

The close positioning of vibrator plates causes an interference of vibrations which necessarily results in deterioration of attenuation characteristics particularly when such a vibrator unit is used for a piezoelectric filter. And, insertion of a metal plate in between the vibrator plates is desired so as to overcome this. However, it is substantially impossible to provide means for supporting, in between vibrator plates 11 and 12, such an electrically conductive metal plate in a perfectly insulated state against supporting arms 12 and 16. Further, for a piezoelectric vibrator unit for more than three vibrator plates of a structure similar to such as shown in FIGS. 2a and 2b, another difficulty is present. That is, however the foregoing secondary vacuum evaporation process for the vibrator plates positioned at both ends could well be effected even after the same have been mounted, it would be impossible to carry out such a secondary vacuum evaporation process on an intermediate vibrator plate. Therefore, every vibrator plate must be subjected, one by one, to such a secondary vacuum evaporation process when it has been mounted and prior to the next one being mounted. Such means for manufacturing piezoelectric vibrator units is naturally extremely troublesome and inefficient.

SUMMARY OF THE INVENTION

It is an object of this invention to provide piezoelectric vibrator units in which, upon operation for the secondary vacuum evaporation to form vacuum evaporated films, each on an excitation electrode previously formed on the vibrator plate, for the microadjustment of vibration frequency of said vibrator plate which has been mounted on a holder means, alignment of the geometrical areas of said vacuum evaporated film and said excitation electrode can be effected correctly and easily.

It is another object of this invention to provide piezoelectric vibrator units each having more than two vibrator plates, in which a metal plate or a metallic film for preventing interference of vibration frequencies of said vibrator plates can easily be interposed and fixed between said vibrator plates.

It is still another object of this invention to provide piezoelectric vibrator units each having more than two vibrator plates, in which said secondary vacuum evaporation operation can be effected easily and efficiently even if each said vibrator plate is provided with more than two pairs of said excitation electrodes.

Further objects and merits of this invention will become apparent from the following description taken in connection with the accompanying drawings.

To achieve the foregoing objects of this invention, a piezoelectric vibrator unit according to this invention comprises at least one piezoelectric vibrator plate each having at least a pair of excitation electrodes formed on the principal faces of the plate, and a substantially flat holder case of an electrically insulating material having a principal face provided with at least one recess each having a contour corresponding to said vibrator plate and encasing the same fixedly therein. The bottom wall of said recess is provided therethrough with at least a port each at a location which corresponds to one of said excitation electrodes which faces said port.

BRIEF DESCRIPTION OF THE DRAWINGS

FIG. 1a is a front elevational view of a piezoelectric vibrator unit of prior art.

FIG. 1b is a side elevational view of the piezoelectric vibrator unit shown in FIG. 1a.

FIG. 2a is an oblique view of another piezoelectric vibrator unit having two vibrator plates of prior art.

FIG. 2b is a plan view of the piezoelectric vibrator unit shown in FIG. 2a.

FIG. 3a is an oblique split view of the first embodiment of this invention.

FIG. 3b is a front elevational view of the embodiment shown in FIG. 3a of this invention.

FIG. 3c is a vertical cross sectional side view of the embodiment shown in FIGS. 3a and 3b drawn in an enlarged scale of this invention.

FIG. 4a is an oblique split view of the second embodiment of this invention.

FIG. 4b is an oblique view of a metal plate to be applied to the embodiment shown in FIG. 4a of this invention.

FIG. 10a is a front elevational view of a vibrator plate applied to the embodiment shown in FIGS. 9a through 9d of this invention.

FIG. 10b is a back elevational view of the vibrator plate shown in FIG. 10a.

FIG. 11 is a plan view of a printed wiring base board applied to the embodiment shown in FIGS. 9a through 9d of this invention.

Figure 5:
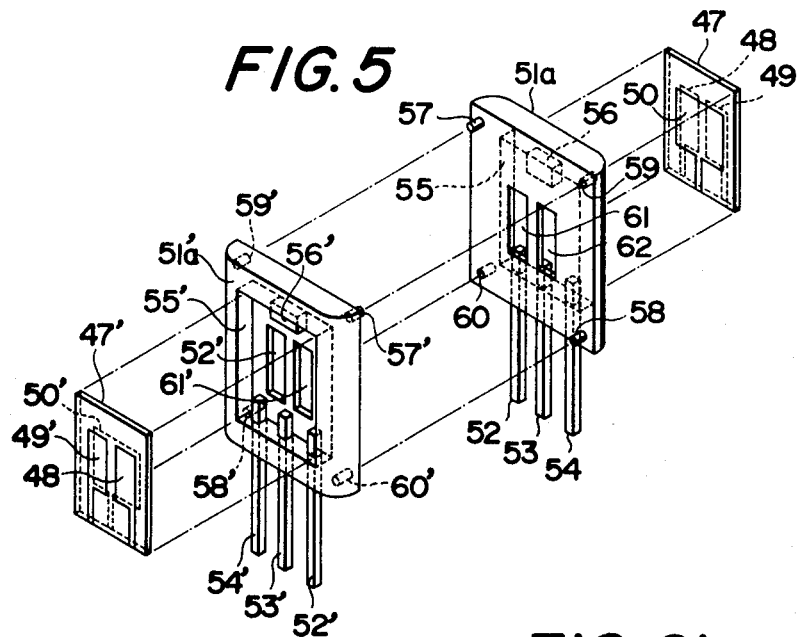
FIG. 5 is an oblique split view of the third embodiment of this invention.

And, FIG. 12 is an electrical connection diagram of the embodiment shown in FIGS. 9a through 9d of this invention.

DETAILED DESCRIPTION OF THE INVENTION

Referring now to FIGS. 3a and 3b, which are shown in an embodiment having a single vibrator plate of this invention, holder case 31 in a flat shape is made of ceramics, epoxy resin or other plastics or glass. Holder case 31 is provided with a recess 32 which has a contour similar to that of vibrator plate 26. Vibrator plate 26 has a pair of excitation electrodes 27 and 37 each formed on a principal face of the plate. Each one of exciting electrodes 27 and 37 having respectively a lead 28 and a lead 38 is formed, prior to the plate being mounted on holder case 31, by means of vacuum evaporation technique. The bottom wall of recess 32 is provided therethrough with a port 34 at a location which corresponds to the area of an electrode 27. Vibrator plate 26 is encased in recess 32 and is seated on a step projection 33 and on the ends 29' and 39' of lead wires 29 and 39 passing through base 36 so as to be fixed with a bonding agent to step projection 33 and said ends of the lead wires. Leads 28 and 38 of the electrodes are connected respectively to the ends 29' and 39' of the lead wires by means of an electrically conductive bonding agent.

As port 34 is provided through the bottom wall of recess 32 at a predetermined location corresponding to electrode 37 which faces port 34, said bottom wall of recess 32 is used for a masking means in an operation for forming a vacuum evaporated film on electrode 37 facing port 34. And, as the alignment of the areas of electrode 37 and port 34 can be made easily, the vacuum evaporation can be made correctly and without fail on an area predetermined on electrode 37. The correct formation of vacuum evaporated film will certainly prevent spurious changes in the vibration frequency and any changes in electric constants of the vibrator plate. Also, as the perforation such as indicated at 35 through which passes a lead wire 29 or 39 can receive an excess amount of an electrically conductive bonding agent that may be used upon a bonding operation of the lead of an electrode of the vibrator plate with an end of the lead wire, deterioration of the series resonant impedance to be caused by said excess amount of the bonding agent that may stick on the lead of the excitation electrode can well be prevented.

Figure 7:
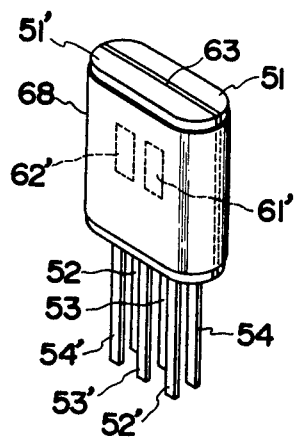
FIG. 7 is a modification of the third embodiment shown in FIG. 5 of this invention.

In FIGS. 4a and 4b is shown another embodiment of this invention. Vibrator plate 47 and holder case 51 compose a piezoelectric vibrator unit on the one side, and vibrator plate 47' and holder 51' compose another piezoelectric vibrator unit on the other side. These two vibrator units in combination with a metal plate 63 inserted between vibrator plates 47 and 47' will compose a compound vibrator unit such as shown in FIG. 7 or in FIGS. 8a, 8b, and 8c.

First, a vibrator unit composed of vibrator plate 47 and holder case 51 will be explained. There is formed split electrodes 48 and 49 on a principal face of vibrator plate 47, and common electrode 50 on the opposite principal face of plate 47 so as to compose two pairs of excitation electrodes. There is provided ports 61 and 62 through the bottom wall of recess 55. These ports are provided at predetermined locations which correspond respectively to areas of electrodes 48 and 49. Vibrator plate 47 is seated on and bonded to step projection 56 and the ends of lead wires 52, 53, and 54 in the same manner as in the foregoing embodiment shown in FIGS. 3a and 3b of this invention. Electrodes 48 and 49 are connected respectively to lead wires 52 and 54, and electrode 50 is connected to lead wire 53. The formation of vacuum evaporated films for the microadjustment of vibration frequency of plate 47 is effected through ports 61 and 62 in the same manner as in the foregoing embodiment of this invention.

In another vibrator unit composed of plate 47' and holder case 51', parts and portions which correspond to those of the foregoing vibrator unit composed of plate 47 and holder case 51 have shapes and structures substantially equal to those of the latter vibrator unit which has already been explained in the foregoing. The corresponding parts and portions are indicated in the figure respectively at an equal numeral, the one bearing a dash and the other without a dash.

Upon a vacuum evaporation operation through the ports provided through the bottom wall of the recess which encases a vibrator plate being effected, a vacuum evaporated film is formed also on the outer wall face of the holder case. And, such a vacuum evaporated film can serve for a shielding means against noise from the exterior.

And, upon plates 47 and 47' being mounted respectively on holder cases 51 and 51', and subsequent secondary vacuum evaporation as mentioned in the foregoing, both vibrator units are coupled with each other together in one body through the medium of a metal plate such as shown in FIG. 4b. In this coupling of the both units, projections 57 and 58 pass respectively through holes 64 and 65 and are received in receiver holes 59' and 60'. Similarly, projections 57' and 58' pass respectively through holes 66 and 67 so as to be received respectively by receiver holes 59 and 60. As mentioned in the foregoing, metal plate 63 is served for preventing mutual interference of two vibrator plates such as plates 47 and 47' which stand close by with each other.

In FIG. 5 is shown a third embodiment of this invention. As compared with the foregoing second embodiment of this invention, holder cases indicated at 51a and 51'a are provided respectively with a recess indicated respectively at 55 and 55' at the outer sides thereof. Accordingly, the foregoing secondary vacuum evaporation is directed from the inner sides of the holder cases. This causes formation of metallic films on said inner sides of the holder cases. Upon the both vibrator units being coupled with each other together, these metallic films formed on the inner sides of the holder cases can well serve for the above-mentioned interference prevention means in place of metal plate 63 appearing in the foregoing embodiment of this invention.

Figure 6B:
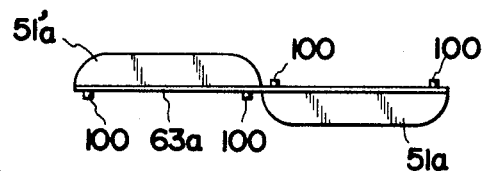
FIG. 6b is a plan view of the embodiment shown in FIG. 6a of this invention.
Figure 6A:
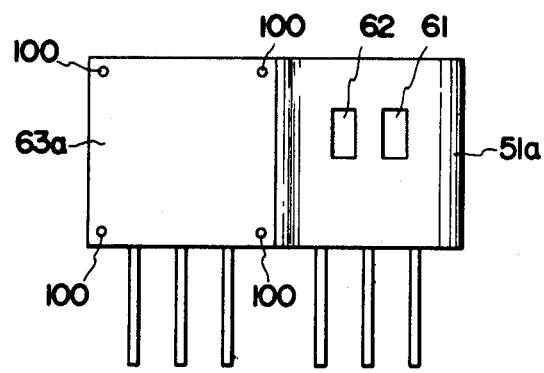
FIG. 6a is a front elevational view of the fourth embodiment of this invention.
Figure 6C:
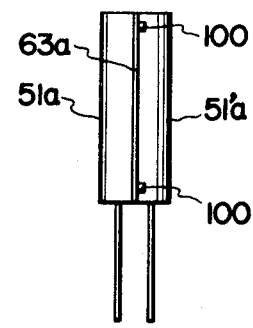
FIG. 6c is a side elevational view of the embodiment shown in FIGS. 6a and 6b of this invention.

There is shown in FIGS. 6a, 6b, and 6c, the fourth embodiment of this invention. As seen from the figures, two vibrator units stand one beside the other at opposite sides of a metal plate 63a and coupled with each other together with projections 100 through the medium of said plate 63a. Holder cases 51a and 51'a are in a shape and of a structure equal to those of holder cases 51 and 51' in FIG. 4a, and encase respectively a vibrator plate such as indicated at 47 or 47' in FIG. 4a. Metal plate 63a is served for the foregoing interference prevention means.

Upon being assembled, the vibrator units which have been explained by reference to FIGS. 4a and 4b will take a form such as shown in FIG. 7 in which, numeral 68 indicates a piece of heat contractible tape or tube for binding the vibrator units with each other together into a compound vibrator unit. Such a tape or tube may be one on which is formed a metallic film on one side or on both sides so that the metallic film may increase ability of noise shielding.

Figures 8A, 8B:
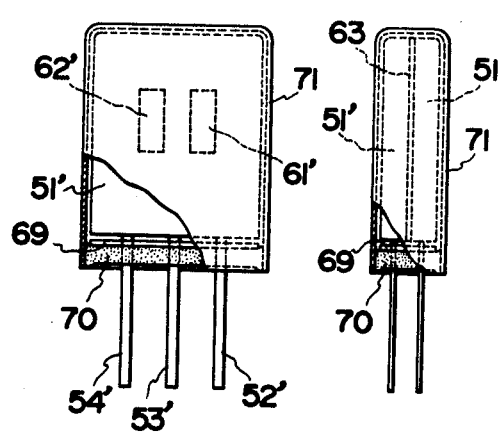
FIG. 8a is a front elevational view partly in section of another modification of the third embodiment shown in FIG. 5 of this invention.
FIG. 8b is a side elevational view of the embodiment shown in FIG. 8a of this invention.
Figure 8C:
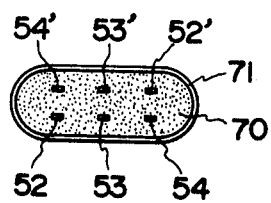
FIG. 8c is a bottom view of the embodiment shown in FIGS. 8a and 8b of this invention.

The vibrator units as shown in FIGS. 4a and 4b may be encased in a metal case 71 appearing in FIGS. 8a, 8b, and 8c. In the figures, 69 is a printed wiring base board, and 70 is an electrically insulating filling agent. In such a modification as to packing of vibrator units, noise suppression feasibility together with mechanical strength and heat-resisting power can be increased.

The modifications such as shown in FIGS. 7, 8a, 8b, and 8c may also be applied to an embodiment such as shown in FIG. 5 of this invention.

Referring finally to FIGS. 9a through 9d, which are shown in a fourth embodiment providing a multimode filter of this invention, 81 is a vibrator plate having split electrodes 82 and 83 formed on one side of the plate and a common electrode 84 on the other side such as shown in FIGS. 10a and 10b. The excitation electrodes together with leads 85, 86, and 87 are formed, prior to the plate being mounted on holder case 88, by means of vacuum evaporation technique. Leads 85 and 86 extend around the edge face of the plate so that the same may be kept in good contact with the lead wires. Such a structure of vibrator plate 81 applies to vibrator plate 81'.

Holder case 88 is provided with a pair of recesses 89 and 89' each having a shape and a structure substantially equal to recess 32 in FIG. 3a except for pairs of ports 91, 93 and 91', 93' so as to effect formation of vacuum evaporated films respectively on a pair of split electrodes 82 and 83 of plate 81 and another pair of split electrodes of plate 81' for the microadjustment of vibration frequencies of the plates.

There is provided also small ports 92 and 92' respectively between ports 91 and 93, and, ports 91' and 93'. These small ports are used for forming vacuum evaporated films on plates 81 and 81' so that the degree of electrical coupling of the vibrator plates for the use of a multimode filter can be adjusted as desired. Provided also is a small recess 94 between recesses 89 and 89' for encasing a coupling condenser 95 which is to be fixed therein with a filling agent 96.

Printed wiring base board 124 located at the lower end of holder case 88 passes lead wires 97, 98, 99, 121, 122, and 123 for the excitation electrodes, and lead wires 120 and 126 for coupling condenser 95 as shown in FIG. 11. These lead wires are soldered to base board 124. As seen from the figure, lead wires 97 and 123 are used respectively for input and output terminals, and lead wires 98 and 122 are used for the ground terminals.

In the course of the formation of vacuum evaporation films on said split electrodes, small port 94 is shuttered. Similarly, ports 91, 93, 91', and 93' are shuttered during the vacuum evaporation operation for forming films in between the split electrodes through small ports 92 and 92'.

Figure 9A:
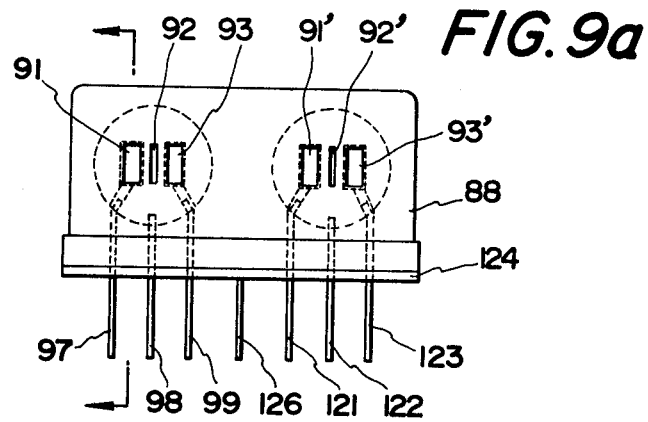
FIG. 9a is a front elevational view of the fourth embodiment of this invention.
Figure 9B:
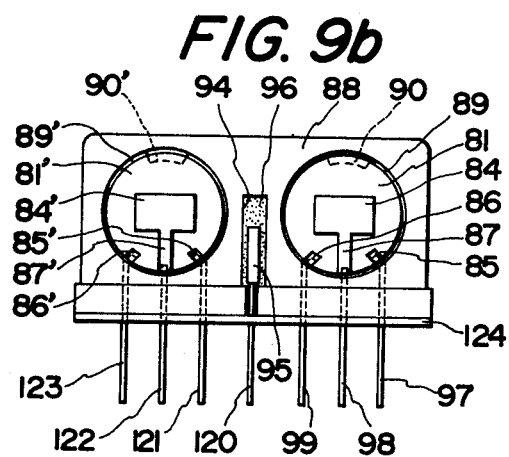
FIG. 9b is a back elevational view of the embodiment shown in FIG. 9a of this invention.
Figure 9D:
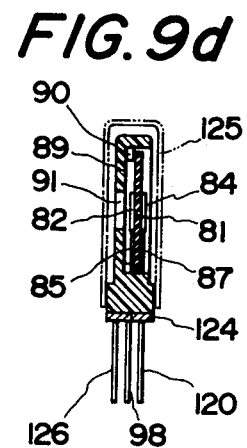
FIG. 9d is a vertical cross sectional view of the embodiment shown in FIGS. 9a, 9b, and 9c of this invention.
Figure 9C:
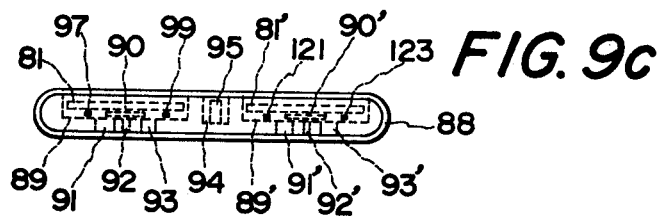
FIG. 9c is a plan view of the embodiment shown in FIGS. 9a and 9b of this invention.

Holder case 88 on which are mounted vibrator plates 81 and 82 and coupling condenser 95 is sealed in a metal or a plastic case 125 by means of soldering or a bonding agent such as shown in FIG. 9d. The space within case 125 is filled with an appropriate inert gas such as nitrogen.

So as to eliminate complication, the embodiments as disclosed in the foregoing of this invention have been limited to vibrator units each having one vibrator plate or two vibrator plates. However, it will easily be seen that the numbers of vibrator plates are not limited in the scope of this invention.

It will be apparent from the foregoing description that, in accordance with this invention, the microadjustment of vibration frequency, by means of forming vacuum evaporated films on the excitation electrodes which have previously been formed on the vibrator plates, can be made correctly and very easily, even in a compound vibrator unit having more than two vibrator plates, with the result that prevention of spurious frequencies and changes in electrical constants of a piezoelectric vibrator unit can certainly be achieved.

We claim:

1. In a piezoelectric vibrator unit having (i) a pair of vibrator assemblies each consisting of a holder case, a vibrator plate having excitation electrode means formed on the principal faces thereof, and lead wires for said excitation electrodes, and (ii) a metal plate for preventing mutual interference between the vibrator plates in said vibrator assemblies, the improvement which comprises, in combination:

(a) said holder case is of an electrically insulating material and has a front side provided with a recess for receiving therein said vibrator plate, (b) said lead wires extend through and are secured in a side wall of said case bounding said recess and have tip portions located in alignment with one another within said recess so that said tip portions can serve for the spacing of said vibrator plate from a bottom wall of said case bounding said recess, (c) said vibrator plate is fixed within said recess by said tip portions being bonded to said excitation electrode means, (d) said bottom wall includes port means therethrough to permit the micro-adjustment of said excitation electrode means facing said bottom wall, (e) said front side of one of said holder cases of said pair of vibrator assemblies faces in a direction opposite to the direction faced by said front side of the other of said holder cases of said pair of vibrator assemblies, (f) said respective front sides of said holder cases are covered by said metal plate and are attached thereto at the respective sides of said metal plate, said pair of vibrator assemblies being coupled fixedly to each other together through the medium of said metal plate, and thereby providing port means for the microadjustment of vibration frequencies of both vibrator plates at the outer faces of said piezoelectric vibrator unit.

2. A piezoelectric vibrator unit, as claimed in claim 1, in which each port is of substantially equal area to and is in alignment with the facing excitation electrode.

3. A piezoelectric vibrator unit, as claimed in claim 1, in which said front sides of said holder cases in said pair of vibrator assemblies are positioned face to face.

4. A piezoelectric vibrator unit, as claimed in claim 1, in which said vibrator assemblies are laterally offset one with respect to the other at different portions of said metal plate.

5. A piezoelectric vibrator unit, as claimed in claim 3, in which said holder cases in said pair of vibrator assemblies are coupled to each other by means of contractible film means binding said holder cases together.

6. A piezoelectric vibrator unit, as claimed in claim 5, in which said contractible film means has a metallic film coated on at least one side thereof.

7. A piezoelectric vibrator unit, as claimed in claim 3, in which said holder cases are disposed in a metal can which is fixed to said holder cases by means of an electrically insulating filling agent covering the walls of said holder cases, said walls having said lead wires extending therethrough.

* * * * *